(12) United States Patent
Ogihara et al.

(10) Patent No.: US 8,927,192 B2
(45) Date of Patent: Jan. 6, 2015

(54) PRODUCTION METHOD OF RESIST COMPOSITION FOR LITHOGRAPHY

(75) Inventors: Tsutomu Ogihara, Jyoetsu (JP); Motoaki Iwabuchi, Jyoetsu (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 54 days.

(21) Appl. No.: 13/605,360

(22) Filed: Sep. 6, 2012

(65) Prior Publication Data

US 2013/0108958 A1 May 2, 2013

(30) Foreign Application Priority Data

Oct. 26, 2011 (JP) ................................ 2011-235224

(51) Int. Cl.
*B01D 35/01* (2006.01)
*G03F 7/004* (2006.01)
*G03F 7/16* (2006.01)
*B01D 36/00* (2006.01)

(52) U.S. Cl.
CPC ................ *G03F 7/16* (2013.01); *B01D 36/001* (2013.01); *G03F 7/004* (2013.01)
USPC ........................................ 430/270.1; 210/406

(58) Field of Classification Search
USPC .................. 430/270.1, 327; 210/106, 406
See application file for complete search history.

(56) References Cited

U.S. PATENT DOCUMENTS

| 7,806,274 B2* | 10/2010 | Scott et al. ..................... 210/406 |
| 2006/0235103 A1* | 10/2006 | Ikeya et al. ..................... 522/174 |
| 2007/0128540 A1* | 6/2007 | Noh et al. .................. 430/270.1 |

FOREIGN PATENT DOCUMENTS

| JP | 56-76216 | * 6/1981 |
| JP | 64-088542 | * 4/1989 |
| JP | A-2008-140964 | 6/2008 |
| JP | A-2010-020297 | 1/2010 |

OTHER PUBLICATIONS

Machine translation of the abstract of JP 64-088542, published on Apr. 3, 1989.*
Machine translation of the abstract of JP 56-76216, published on Jun. 23, 1981.*
Translation of JP 56-076216, published in Jun. 1981.*
Translation of JP 64-088542, published in Apr. 1989.*
Aug. 19, 2014 Notification of Reasons for Refusal issued in Japanese Patent Application No. 2011-235224 (with partial translation).

* cited by examiner

*Primary Examiner* — Anca Eoff
(74) *Attorney, Agent, or Firm* — Oliff PLC

(57) ABSTRACT

A production method of a resist composition for lithography, including, at least: a filtering step for filtering a resist composition for lithography by a filter therethrough, wherein in the filtering step, the resist composition for lithography is passed through the filter after an interior of a vessel having the filter installed therein is kept under reduced pressure. There can be provided a resist composition for lithography capable of decreasing occurrences of defects such as coating defects and pattern defects.

4 Claims, 1 Drawing Sheet

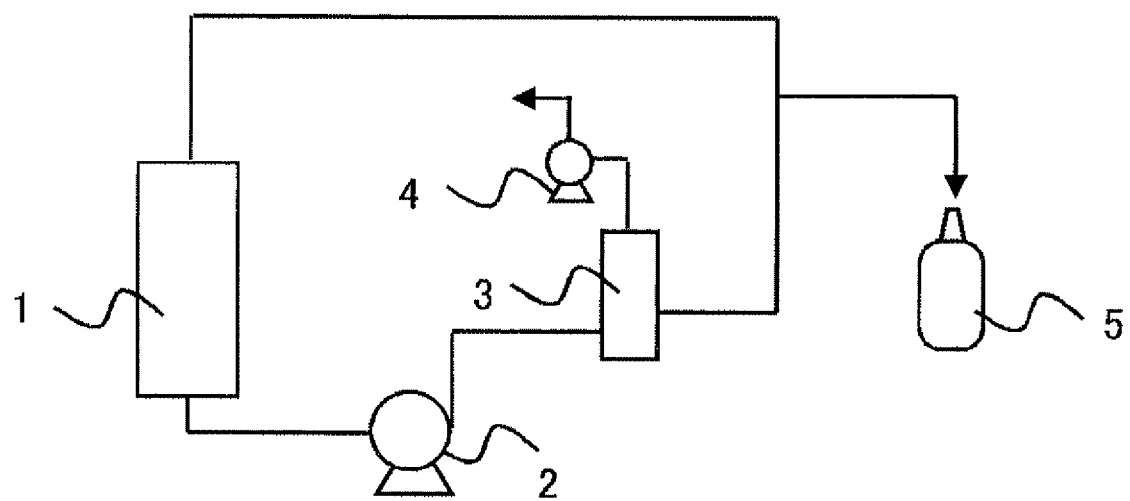

PRODUCTION METHOD OF RESIST COMPOSITION FOR LITHOGRAPHY

BACKGROUND OF THE INVENTION

1. Field of the Invention

The present invention relates to a production method of a resist composition for lithography, and specifically to a production method of a resist composition for lithography capable of decreasing occurrences of defects such as coating defects and pattern defects.

2. Description of the Related Art

With enhanced integration degrees and increased speeds of LSI's, miniaturization of pattern sizes is being rapidly progressed. The lithography technique has achieved formation of finer patterns, by appropriately adopting a light source having a shorter wavelength and a resist composition suitable therefor, in step with such a scaling down. Along this trend, resins to be used for photoresist compositions have been required to be low in light absorption at exposure wavelengths, respectively, resulting in a transition of resins from a novolak resin through polyhydroxystyrene to a resin having an aliphatic polycyclic structure along with a progressive transition of exposure light from i-line through KrF to ArF.

Further, in case of scaling down using the same light source in a manner to achieve the scaling down while keeping a thickness of an adopted photoresist film as it is, i.e., in a manner to merely narrow pattern line widths, the photoresist pattern after development is increased in aspect ratio of line profile, thereby resultingly causing a pattern collapse. Thus, along with the scaling down, photoresist films have been decreased in thickness such that aspect ratios of line profiles of photoresist patterns are kept in appropriate ranges, respectively.

Meanwhile, for processing a substrate to be processed, such a method is typically adopted to use a patterned photoresist film as an etching mask, in a manner to process the substrate to be processed by dry etching. This means that substrates to be processed are required to be dry etched by using photoresist films each made to be thinner and thus weaker in etching resistance due to the above circumstances, thereby requiring to promptly ensure obtainment of a material and the like to be used in such a processing step.

Examples of methods for solving such a problem include a multi-layer resist method. This method is configured to: place a resist lower layer film between a photoresist film, i.e., resist upper layer film, and a substrate to be processed, the resist lower layer film having an etching selectivity different from that of the resist upper layer film; obtain a pattern in the resist upper layer film; subsequently transfer the pattern into the lower layer film by dry etching, by using the upper resist pattern as a dry etching mask; and transfer the pattern into the substrate to be processed by dry etching, by using the lower layer film as a dry etching mask.

In this way, resist compositions to be used in a lithography process have been decreased in film thickness and increased in the number of layers, in forming fine patterns. Then, coated films to be formed from compositions to be used at this time are decreased in film thickness, so that even minute defects tend to affect a yield of a process.

To decrease such defects in a composition for liquid immersion exposure, there has been exemplarily known a method for decreasing an amount of dissolved gas in the composition (see Japanese Patent Laid-Open (kokai) No. 2010-020297).

SUMMARY OF THE INVENTION

However, it has been revealed to be impossible to sufficiently decrease defects supposed to be caused by gas bubbles, even by such a conventional method.

The present invention has been carried out in view of the above problems, and it is therefore an object of the present invention to provide a production method of a resist composition for lithography capable of decreasing occurrences of defects such as coating defects and pattern defects.

To solve the problems mentioned above, the present invention provides a production method of a resist composition for lithography, comprising, at least:

a filtering step for filtering a resist composition for lithography by a filter therethrough, wherein in the filtering step, the resist composition for lithography is passed through the filter after an interior of a vessel having the filter installed therein is kept under reduced pressure.

According to such a production method, it is allowed to provide such a resist composition for lithography capable of removing a dissolved gas in the composition in the filtering step, thereby enabling to decrease occurrences of defects such as coating defects and pattern defects.

In addition, it is preferable that the method is configured, in the filtering step, to clean the interior of the vessel by a cleaning solution after the filter is installed in the vessel, and to thereafter keep the interior of the vessel under reduced pressure.

Conducting a cleaning in such a manner enables to wash away fine particles present in the filter vessel and the like, thereby further improving a quality of the obtained resist composition for lithography.

In addition, the method may be configured to use, as the resist composition for lithography, one of a composition for forming a resist top coat, a photoresist composition, a resist composition for EUV, a resist composition for EB, a composition for forming a silicon-containing resist lower layer film, and a composition for forming an organic resist lower layer film.

In this way, the present invention is utilizable upon production of various known resist compositions, and is thus useful.

According to the production method of a resist composition for lithography of the present invention as mentioned above, it is enabled to prevent a gas present in the filter from dissolving in the composition during the filtering step, thereby allowing to decrease occurrences of defects such as coating defects and pattern defects by adopting the composition produced by the present invention. Particularly, since it is impossible to fill all fine pores present in a filter with a liquid to be treated when the liquid is simply passed through the filter in case that the filter has a critical particle diameter of 50 nm or smaller, the residual gas is caused to accompany the composition and to exit from the filter in a manner that the thus accompanying gas is directly coated onto a substrate and thereafter observed as a coating defect(s) in a bubble form. Nonetheless, such a situation can be avoided according to the present invention. Further, it is possible to limit dissolution of gas to a minimal extent during a production process by conducting the filtering step in the present invention just before filling of the product, in a manner enabling to assuredly restrict occurrences of defects caused by gas bubbles in a coated film to be formed by coating the composition obtained by the production method. This also improves a yield of a production process.

BRIEF DESCRIPTION OF THE ACCOMPANYING DRAWINGS

FIG. 1 is a drawing which shows an example of an apparatus to be used in the production method of the present invention.

DETAILED DESCRIPTION OF THE PREFERRED EMBODIMENTS

The present invention will be explained hereinafter, without limited thereto.

As resist compositions to be used in a lithography process have been decreased in film thickness and increased in the number of layers as described above, that affection on a yield of a process which is to be brought about by defects also has been made progressively serious.

However, it has been revealed that defects supposed to be caused by gas bubbles in a composition have not been sufficiently decreased insofar as by the conventional method.

As such, the present inventors have investigated a reason why gases are dissolved in a composition, and have newly revealed that, gases remaining in closed ones of those fine pores which are present in a filter are dissolved in a composition during filtration in a filtering step, and these gases are separated from the composition upon formation of a coated resist film in a manner to become minute gas bubbles which remain in the coated film, thereby resultingly causing pattern abnormalities leading to a deteriorated yield of a production process.

Thus, the present inventors have earnestly conducted a further investigation based on the above finding, and resultingly found out a possibility of provision of a method configured to once keep a vessel (filter vessel) for installing therein a filter to be used in a filtering step of a resist composition for lithography, under reduced pressure (i.e., under a pressure lower than the atmospheric pressure) so as to prevent dissolution of gases in the composition, thereby obtaining a coated film containing no gas bubbles therein, to accomplish the present invention.

The present invention will be explained hereinafter in more detail.

The present invention resides in a production method of a resist composition for lithography, comprising, at least:

a filtering step for filtering a resist composition for lithography by a filter therethrough, wherein in the filtering step, the resist composition for lithography is passed through the filter after an interior of a vessel having the filter installed therein is kept under reduced pressure.

The production method of the present invention is also usable upon production of any one of known resist compositions, and examples of the resist compositions for lithography in this case include: a composition for forming a resist top coat to be used in a liquid immersion exposure process; a composition (a photoresist composition, a resist composition for EUV, a resist composition for EB, or the like) for forming a resist film of a type sensitive to a high energy beam, to be used in case of conducting exposure by UV light, excimer laser, X-rays, electron beam, or the like; a composition for forming a silicon-containing resist lower layer film; a composition for forming an organic resist lower layer film; and the like.

Those filters to be used then are preferably made of materials such as polyethylene, polypropylene, fluororesins, polyamide-based resins, and the like, and exemplary forms thereof include a pleat type, a hollow fiber type, and the like.

The pressure in the filter vessel after installation of the filter therein is to be kept under reduced pressure, preferably at −50 kPaG or lower, and more preferably −90 kPaG or lower. Further preferably, the interior is to be kept in a vacuum state.

To bring the interior of the filter vessel having the filter installed therein into a state of pressure lower than the atmospheric pressure as described above is not restricted in particular, it is enough to provide the filter vessel with a vacuum pump, and to use it to vacuum the interior of the vessel, for example.

Hereinafter, the embodiments according to the present invention will be explained with reference to drawings, but the present invention is not limited thereto.

FIG. 1 shows an example of an apparatus to be used in the production method of the present invention. This apparatus is constituted of a tank 1, a liquid feeding pump 2, a filter vessel 3, a vacuum pump 4, pipings (including pipings not shown in the figure) and valves (including valves not shown in the figure) accompanying to the previous elements, and the like.

Firstly set in the filter vessel 3 is a filter to be used for filtration of a resist composition, and upstream and downstream of the filter vessel 3 (i.e., paths between the filter vessel 3 and the pipings accompanying thereto) are shut off thereafter, followed by evacuation by the vacuum pump 4 to bring the interior of the filter vessel 3 to vacuum.

Further, if required, it is possible to similarly keep other locations such as at pipings between the filter vessel 3 and the tank 1, in a state of pressure lower than the atmospheric pressure.

At this time, it is also possible to clean the interior of the filter vessel 3 by a cleaning solution so as to remove fine particles and the like present in the filter vessel 3 therefrom after the filter is installed therein, and to subsequently keep the interior of the filter vessel 3 under reduced pressure.

The cleaning can be conducted, for example, by feeding the cleaning solution from a separately provided tank for the cleaning solution or from the tank 1 filled with the cleaning solution, and may be conducted as circulating cleaning.

Preferably usable as the cleaning solution is pure water, a main solvent of the resist composition for lithography, or the like. The cleaning solution after cleaning is to be exemplarily exhausted from an exhaust valve (not shown) of the filter vessel 3 or the like.

After keeping the interior of the filter vessel 3 under reduced pressure, the resist composition for lithography contained in the tank 1 is passed through the filter vessel 3 by using the liquid feeding pump 2, thereby allowing to filter the resist composition in a state where gases are not present in the filter vessel 3 (i.e., a state where gases remaining in the filter have been removed).

Although the thus filtered resist composition for lithography may be filled into the product container 5 immediately after the filtration, it is also possible to conduct such a circulating filtration in the pipings that the filtrate after filtration at the filter vessel 3 is returned into the tank 1 as shown in FIG. 1, for the exemplary purpose of more assuredly removing fine particles and the like in the resist composition for lithography therefrom. In case of conduction of the circulating filtration, it is enough to change over the applicable valve to fill the product (resist composition for lithography) into the product container 5, once the number of fine particles in the liquid is determined to be a predetermined value or lower (i.e., once the number of fine particles is made to be substantially constant in fluctuation), based on a liquid-borne particle counter.

EXAMPLES

Although the present invention will be explained hereinafter in more detail by describing Examples, the present invention is not limited to these Examples.

Example

The apparatus shown in FIG. 1 was used. Firstly set into the filter vessel 3 was a cartridge filter made of polyethylene (nominal critical particle diameter of 0.005 micrometer, and filtration area of 2.2 square meters), then upstream and downstream of the filter vessel 3 (i.e., paths between the filter vessel 3 and the pipings accompanying thereto) were shut off by valves, followed by evacuation by the vacuum pump 4 to bring the interior of the filter vessel 3 to −99 kPaG. The vacuum pump 4 was then isolated from the filter vessel 3, at that pressure.

Subsequently, the valve under the tank 1 containing therein a composition for forming a silicon-containing resist lower layer film was opened to fill the associated piping with the composition, followed by opening of a front valve positioned upstream of the filter vessel 3, thereby fully filling the filter vessel 3 with the composition for forming the silicon-containing film.

Subsequently opened were a back valve positioned downstream of the filter vessel 3 and a valve at an upper portion of the tank 1, and the liquid feeding pump 2 was actuated, so that circulating filtration of the composition for forming the silicon-containing film was conducted in the pipings. The applicable valve was changed over to fill the product into the product container 5, once the number of fine particles in the liquid was determined to be a predetermined value or lower (i.e., once the number of fine particles was made to be substantially constant in fluctuation), based on the liquid-borne particle counter.

This product container was connected to Clean Track ACT12 manufactured by Tokyo Electron Ltd., thereby forming a coated film on a silicon substrate having a diameter of 300 mm. This coated film was inspected by Defect Inspection Equipment manufactured by KLA-Tencor Corporation, to measure the number of coating defects. As a result, defects of 0.12 micrometer or larger were 30 in number, which was a level substantially free of problem.

Comparative Example

Filled into the product container 5 was the product (composition for forming a silicon-containing resist lower layer film) in entirely the same procedure as the Example, except for omission of the procedure for evacuating the filter vessel 3 to vacuum it by the vacuum pump 4.

This product container was connected to Clean Track ACT12 manufactured by Tokyo Electron Ltd., thereby forming a coated film on a silicon substrate having a diameter of 300 mm. This coated film was inspected by Defect Inspection Equipment manufactured by KLA-Tencor Corporation, to measure the number of coating defects. As a result, defects of 0.12 micrometer or larger were 1,000 in number. These defects were observed by a scanning electron microscope manufactured by KLA-Tencor Corporation, and 98% thereof were determined to be concave types supposed to be caused by gas bubbles, respectively.

From the results of the Example and Comparative Example, it was confirmed that the coated film formed by coating the composition obtained by the production method of a resist composition for lithography of the present invention was capable of restricting occurrence of defects caused by gas bubbles. This means that it has been proven that dissolution of gases during a production process can be minimized according to the production method of a resist composition for lithography of the present invention.

It is to be noted that the present invention is not limited to the above embodiments. The above embodiments are merely illustrative, and whatever having the substantially same configurations as the technical concept recited in the appended claims and exhibiting the same functions and effects are embraced within the technical scope of the present invention.

What is claimed is:

1. A production method of a resist composition for lithography, comprising, at least:
   a filtering step for filtering a resist composition for lithography by a filter therethrough, the filter having fine pores that allow the resist composition for lithography to pass therethrough and having a critical particle diameter of 50 nm or smaller,
   wherein in the filtering step, after an interior of a vessel having the filter installed therein is kept under reduced pressure so that gases remaining in the filter are removed, the resist composition for lithography is passed through the filter.

2. The production method of a resist composition for lithography according to claim 1, wherein the method is configured, in the filtering step, to clean the interior of the vessel by a cleaning solution after the filter is installed in the vessel, and to thereafter keep the interior of the vessel under reduced pressure.

3. The production method of a resist composition for lithography according to claim 1, wherein the method is configured to use, as the resist composition for lithography, one of a composition for forming a resist top coat, a photoresist composition, a resist composition for EUV, a resist composition for EB, a composition for forming a silicon-containing resist lower layer film, and a composition for forming an organic resist lower layer film.

4. The production method of a resist composition for lithography according to claim 2, wherein the method is configured to use, as the resist composition for lithography, one of a composition for forming a resist top coat, a photoresist composition, a resist composition for EUV, a resist composition for EB, a composition for forming a silicon-containing resist lower layer film, and a composition for forming an organic resist lower layer film.

* * * * *